(12) United States Patent
Qin et al.

(10) Patent No.: US 11,188,115 B2
(45) Date of Patent: Nov. 30, 2021

(54) SEQUENCE SIGNAL GENERATOR AND SEQUENCE SIGNAL GENERATION METHOD

(71) Applicant: University of Science and Technology of China, Anhui (CN)

(72) Inventors: Xi Qin, Anhui (CN); Wenzhe Zhang, Anhui (CN); Lin Wang, Anhui (CN); Yu Tong, Anhui (CN); Xing Rong, Anhui (CN); Jiangfeng Du, Anhui (CN)

(73) Assignee: University of Science and Technology of China, Anhui (CN)

( * ) Notice: Subject to any disclaimer, the term of this patent is extended or adjusted under 35 U.S.C. 154(b) by 28 days.

(21) Appl. No.: 16/644,937

(22) PCT Filed: Feb. 11, 2018

(86) PCT No.: PCT/CN2018/076207
§ 371 (c)(1),
(2) Date: Mar. 5, 2020

(87) PCT Pub. No.: WO2019/153288
PCT Pub. Date: Aug. 15, 2019

(65) Prior Publication Data
US 2021/0004041 A1    Jan. 7, 2021

(51) Int. Cl.
*G06F 1/03* (2006.01)
(52) U.S. Cl.
CPC ................... *G06F 1/0321* (2013.01)
(58) Field of Classification Search
CPC .................. G06F 1/0321; G06F 1/02
(Continued)

(56) References Cited

U.S. PATENT DOCUMENTS

| 3,725,793 A * | 4/1973 | Phillips ..................... G06F 1/10 327/160 |
| 9,584,105 B1 | 2/2017 | Foley |
| 2019/0196999 A1* | 6/2019 | Qin .......................... G06F 1/14 |

FOREIGN PATENT DOCUMENTS

| CN | 102109875 A | 6/2011 |
| CN | 105116401 A | 12/2015 |

(Continued)

OTHER PUBLICATIONS

International Search Report and Written Opinion for International Application No. PCT/CN2018/076207, dated Nov. 16, 2018.

(Continued)

*Primary Examiner* — Tan V Mai
(74) *Attorney, Agent, or Firm* — Wolf, Greenfield & Sacks, P.C.

(57) ABSTRACT

A sequence signal generator and a sequence signal generation method are provided. In the sequence signal generation method, a waveform output instruction sent by a host computer is received to acquire waveform data. The waveform data includes original square wave sequence data and target square wave sequence data, and the target square wave sequence data includes a preliminary delay parameter and a secondary delay parameter. An original square wave sequence signal is acquired according to the original square wave sequence data. According to the preliminary delay parameter, preliminary delay processing is performed on the original square wave sequence signal to acquire an intermediate square wave sequence signal, and according to the secondary delay parameter, secondary delay processing is performed on the intermediate square wave sequence signal to acquire a target square wave sequence signal.

11 Claims, 5 Drawing Sheets

(58) Field of Classification Search
USPC .......................................................... 708/271
See application file for complete search history.

(56) References Cited

FOREIGN PATENT DOCUMENTS

| | | |
|---|---|---|
| CN | 105718404 A | 6/2016 |
| CN | 107368144 A | 11/2017 |
| WO | WO 2017/124219 A1 | 7/2017 |

OTHER PUBLICATIONS

Extended European Search Report for European Application No. 18904613.9, dated Jul. 30, 2021.
Kellermann, Creating a Controllable Oscillator Using the Virtex-5 FPGA IODELAY Primitive. Xilinx. xilinx.com/support/documentation/application_notes/xapp872.pdf. Apr. 28, 2009:1-17.

* cited by examiner

SEQUENCE SIGNAL GENERATOR AND SEQUENCE SIGNAL GENERATION METHOD

This application is a national stage filing under 35 U.S.C. § 371 of International Patent Application Serial No. PCT/CN2018/076207, titled "SEQUENCE SIGNAL GENERATOR AND SEQUENCE SIGNAL GENERATION METHOD", filed on Feb. 11, 2018. The contents of which is incorporated herein by reference in its entirety.

FIELD

The present disclosure relates to the technical field of pulse signals, and particularly, to a sequence signal generator and a sequence signal generation method.

BACKGROUND

A sequence signal is a serial signal in which a set of binary digits 0 and 1 are arranged according to a certain rule. It can be used as a synchronization signal, an address code, data, a control signal, or the like. A sequence signal generator is an instrument that generates a series of specific square wave sequence signals.

In recent years, with the rapid development of electronic science and technology and related research fields, sequence signal generators have been widely used in advanced scientific research fields such as aerospace, communications, automation control, electronic precision instruments, basic physics, and even medical biology. High-precision square wave sequence signals can be used as high-precision timing control signals and high-stability excitation signals. High-precision square wave sequence signals can be used not only in the fields of ultrasound, radar, medical imaging, laser control, communications, etc., but also in advanced scientific fields such as quantum computing, quantum communication, and quantum precise measurement.

Among related technologies, a kind of sequence signal generator is implemented by a high-speed clock method, which uses a high-speed clock signal as a reference for a square wave sequence signal. That is, a square wave sequence signal is generated by changing an output level of a square wave channel on the rising or falling edge of the high-speed clock signal. The time precision of square wave sequence signals generated by the high-speed clock method is limited by the operating clock frequency. The clock frequency of the order of GHz can leads to the time precision of the order of nanosecond, but on this basis it is very difficult to further improve the operating frequency. Therefore, the high-speed clock method for generating a square wave sequence signal is not suitable for applications requiring sequences of higher precision.

With the continuous development of science, technology and experimental methods, higher and higher time precision of sequence signal generators is required. Therefore, it is desired to provide a sequence signal generator with higher time precision.

SUMMARY

In view of this, the present disclosure provides a sequence signal generator to generate a sequence signal with higher time precision.

To achieve the above purpose, the present disclosure provides the following technical solutions.

In a first aspect, the present disclosure provides a sequence signal generator including a communication module, a waveform output module, a waveform data storage module, and a time delay module. The time delay module includes at least one preliminary delay unit and at least one secondary delay unit. A delay time of the preliminary delay unit is greater than a delay time of the secondary delay unit, and the delay time of the preliminary delay unit and the delay time of the secondary delay unit are both less than a system clock cycle.

The communication module is configured to receive an instruction sent by a host computer and transmit the instruction to the waveform output module.

The waveform output module is configured to, in a case of determining the instruction as a waveform output instruction, read waveform data from the waveform data storage module in response to the instruction, where the wave data includes original square wave sequence data and target square wave sequence data; generate an original square wave sequence signal based on the original square wave sequence data; and transmit the original square wave sequence signal and the target square wave sequence data to the time delay module, where the target square wave sequence data includes a preliminary delay parameter and a secondary delay parameter.

The time delay module is configured to perform a preliminary delay processing on the original square wave sequence signal by the at least one preliminary delay unit according to the preliminary delay parameter to acquire an intermediate square wave sequence signal, and perform a secondary delay processing on the intermediate square wave sequence signal by the at least one secondary delay unit according to the secondary delay parameter to acquire a target square wave sequence signal, and output the target square wave sequence signal.

Optionally, the time delay module further includes a first multiplex selection controller and a second multiplex selection controller.

The at least one preliminary delay unit is configured to perform the preliminary delay processing on the original square wave sequence signal.

The first multiplex selection controller is configured to determine an output node for the original square wave sequence signal in the at least one preliminary delay unit according to the preliminary delay parameter, and acquire the intermediate square wave sequence signal at the output node.

The at least one secondary delay unit is configured to perform the secondary delay processing on the intermediate square wave sequence signal.

The second multiplex selection controller is configured to determine an output node for the intermediate square wave sequence signal in the at least one secondary delay unit according to the secondary delay parameter, and acquire the target square wave sequence signal at the output node.

Optionally, the preliminary delay parameter includes a rising-edge preliminary delay stage number and a falling-edge preliminary delay stage number, and the secondary delay parameter includes a rising-edge secondary delay stage number and a falling-edge secondary delay stage number.

The first multiplex selection controller is configured to determine a first output node for a rising edge of the original square wave sequence signal in the at least one preliminary delay unit according to the rising-edge preliminary delay stage number, and determine a second output node for a falling edge of the original square wave sequence signal in the at least one preliminary delay unit according to the falling-edge preliminary delay stage number.

The intermediate square wave sequence signal is acquired as the original square wave sequence signal passing through the first output node or the second output node of the at least one preliminary delay unit.

The second multiplex selection controller is configured to determine a third output node for a rising edge of the intermediate square wave sequence signal in the at least one preliminary delay unit according to the rising-edge secondary delay stage number, and determine a fourth output node for a falling edge of the intermediate square wave sequence signal in the at least one secondary delay unit according to the falling-edge secondary delay stage number. The target square wave sequence signal is acquired as the intermediate square wave sequence signal passing through the third output node or the fourth output node of the at least one secondary delay unit.

Optionally, the waveform data storage module is further configured to store a waveform data correction value corresponding to the waveform data. A deviation between a square wave sequence signal corresponding to the waveform data correction value and the target square wave sequence signal corresponding to the waveform data is minimal. The waveform data correction value includes a correction value of the original square wave sequence data and a correction value of the target square wave sequence data.

The waveform output module is further configured to search for, from the waveform storage module, the waveform data correction value corresponding to the waveform data, generate the original square wave sequence signal according to the correction value of the original square wave sequence data, and transmit the original square wave sequence signal and the correction value of the target square wave sequence data to the time delay module. The correction value of the target square wave sequence data includes a preliminary delay parameter correction value and a secondary delay parameter correction value.

The time delay module is further configured to perform the preliminary delay processing on the original square wave sequence signal according to the preliminary delay parameter correction value by the preliminary delay unit to acquire the intermediate square wave sequence signal, and perform the secondary delay processing on the intermediate square wave sequence signal according to the secondary delay parameter correction value to acquire the target square wave sequence signal, and output the target square wave sequence signal.

Optionally, the original square wave sequence data includes a high level hold time and a low level hold time. The high level hold time is represented as a number of the system clock cycles during which a high level is held, and the low level hold time is represented as a number of the system clock cycles during which a low level is held.

The waveform output module is configured to generate the original square wave sequence signal based on the original square wave sequence data by: generating a high level signal and holding the high level signal for the high level hold time; and switching to generate a low level signal and holding the low level signal for the low level hold time.

Optionally, the waveform output module is further configured to store the waveform data received through the communication module into the waveform data storage module in a case that the instruction is a waveform storage instruction.

In a second aspect, the present disclosure further provides a sequence signal generation method, including the following steps.

Target output waveform information is acquired.

Target waveform data is acquired according to the target output waveform information and a system parameter of a sequence signal generator. The target waveform data includes original square wave sequence data and target square wave sequence data. The system parameter includes a system clock cycle, a delay time of a preliminary delay unit and a delay time of a secondary delay unit. The delay time of the preliminary delay unit is greater than the delay time of the secondary delay unit, and the delay time of the preliminary delay unit and the delay time of the secondary delay unit are both less than the system clock cycle.

The target waveform data is sent to the sequence signal generator for storage.

A waveform output instruction is sent to the sequence signal generator, to control the sequence signal generator to acquire the target waveform data in response to the waveform output instruction, and generate an original square wave sequence signal according to the original square wave sequence data, perform a preliminary delay processing on the original square wave sequence signal according to a preliminary delay parameter in the target square wave sequence data to acquire an intermediate square wave sequence signal, and perform a secondary delay processing on the intermediate square wave sequence signal according to a secondary delay parameter in the target square wave sequence data to acquire a target square wave sequence signal.

Optionally, the step of acquiring the target waveform data according to the target output waveform information and the system parameters of the sequence signal generator includes the following steps.

The original square wave sequence data, the preliminary delay parameter, and an initial secondary delay parameter are calculated according to the target square wave waveform information and the system parameters.

It is determined whether the initial secondary delay parameter is in a preferred parameter range, where in the preferred parameter range, a the deviation of a time delay chain composed of the secondary delay unit in the sequence signal generator is less than a preset threshold.

If the initial secondary delay parameter is less than a minimum value of the preferred parameter range, the initial secondary delay parameter is increased by a specified delay to acquire the secondary delay parameter so that each secondary delay parameter of the target waveform data is in the preferred parameter range.

Optionally, the method further includes a step of acquiring a waveform data correction value corresponding to the target waveform data by looking up a waveform data calibration comparison table, and using the waveform data correction value as the target waveform data.

In a third aspect, the present disclosure also provides another sequence signal generation method, including the following step.

An instruction is received from a host computer.

Waveform data is acquired in response to the instruction if determining the instruction as a waveform output instruction. The waveform data includes original square wave sequence data and target square wave sequence data. The target square wave sequence data includes a preliminary delay parameter and a secondary delay parameter.

An original square wave sequence signal is generated according to the original square wave sequence data.

A preliminary delay processing is performed on the original square wave sequence signal according to the preliminary delay parameter to acquire an intermediate square wave sequence signal.

A secondary delay processing is performed on the intermediate square wave sequence signal according to the secondary delay parameter to acquire a target square wave sequence signal.

The sequence signal generator provided in this disclosure includes a communication module, a waveform output module, a waveform data storage module, and a time delay module. The time delay module includes at least one preliminary delay unit and at least one secondary delay unit. The communication module receives a waveform output instruction sent by a host computer and sends it to the waveform output module. The waveform output module parses the waveform output instruction to acquire a storage address of the waveform data, and reads original square wave sequence data and target square wave sequence data from the waveform data storage module according to the storage address. The original square wave sequence signal is acquired according to the original square wave sequence data, and the original square wave sequence signal and the target square wave sequence data are transmitted to the time delay module. The time delay module performs a preliminary delay processing on the original square wave sequence signal by the preliminary delay unit according to a preliminary delay parameter in the target square wave sequence data to acquire an intermediate square wave sequence signal. Then, the time delay module performs a secondary delay processing on the intermediate square wave sequence signal by the secondary delay unit according to a secondary delay parameter in the target wave sequence data to acquire the target square wave sequence signal. Limited by the existing production process, there is some deviation between the actual delay time of the secondary delay units and the rated delay time, which causes non-linearity of a delay chain composed of multiple secondary delay units. The delay chain usually has a section of low non-linearity and a section of high non-linearity. Generally, a long delay chain is more difficult to control the non-linearity. This sequence signal generator uses the preliminary delay unit having a large delay time, to reduce the number of used secondary delay units. That is, the length of the delay chain composed of secondary delay units is reduced, so that the used time delay chain is in the favorable non-linear section. Therefore, the influence on the time precision of the square wave sequence signal caused by the section of high non-linearity of the delay chain is eliminated, and thus the time precision of generating the square wave sequence signal is improved.

BRIEF DESCRIPTION OF THE DRAWINGS

In order to describe the technical solutions in the embodiments of the present disclosure or the conventional technology more clearly, the drawings used in the description of the embodiments of the present disclosure or the conventional technology are briefly described hereafter. Apparently, the drawings in the following description show merely some embodiments of the present disclosure. For those of ordinary skill in the art, other drawings can be acquired according to the provided drawings without any creative effort.

DETAILED DESCRIPTION

The sequence signal generator provided in the embodiment of the present disclosure performs a time delay processing on the original sequence signal sequentially by a preliminary delay unit and a secondary delay unit having different delay time parameters to acquire a target square wave sequence signal. By using an appropriate number of the preliminary delay units, it is achieved that only the section of low non-linearity of a delay chain composed of the secondary delay units is used, that is, the effect on the time precision of the square wave sequence caused by the section of high non-linearity of the delay chain is eliminated, thus improving the time precision of the square wave sequence signal.

The technical solutions in the embodiments of the present disclosure are clearly and completely described hereafter with reference to the drawings in the embodiments of the present disclosure. Apparently, the described embodiments are only a part of the embodiments of the present disclosure, but not all of the embodiments. Based on the embodiments in the present disclosure, all other embodiments acquired by those of ordinary skill in the art without creative efforts fall within the protection scope of the present disclosure.

Figure 1:
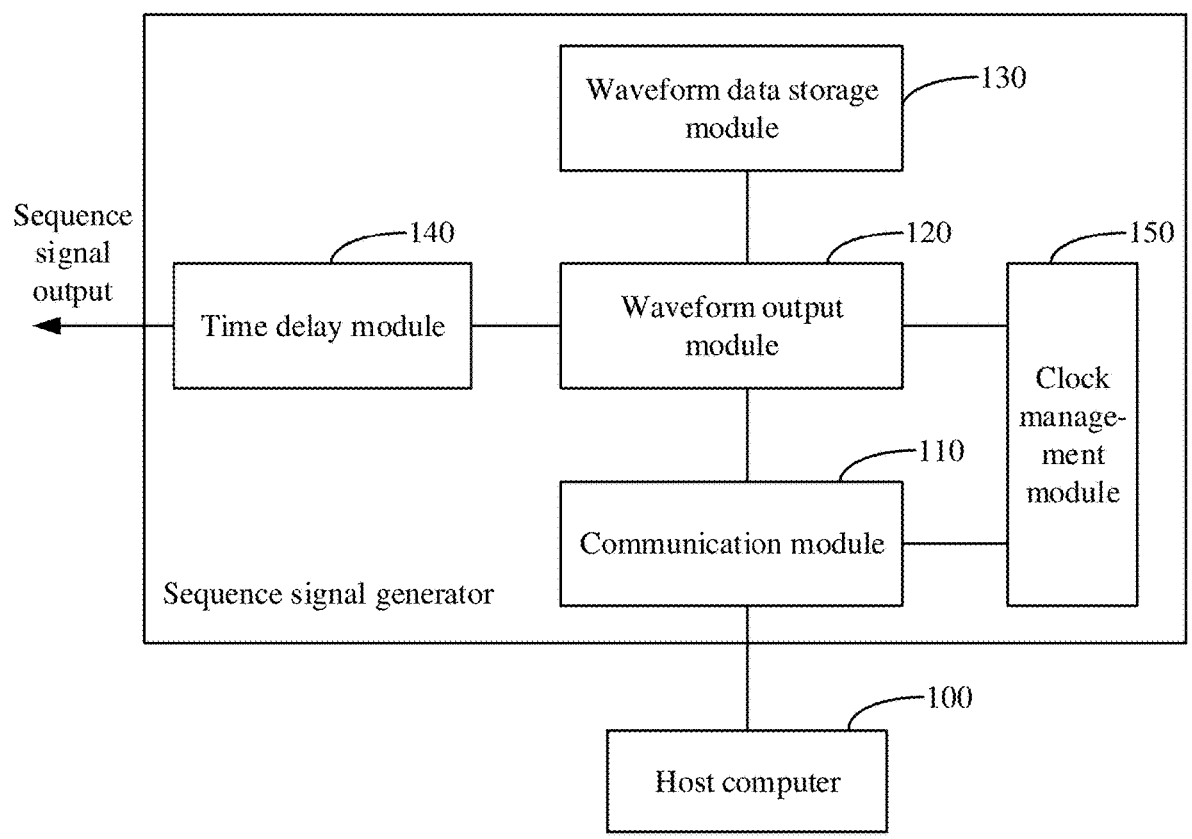
FIG. 1 is a structural block diagram of a sequence signal generator according to an embodiment of the present disclosure.

FIG. 1 shows a structural block diagram of a sequence signal generator according to an embodiment of the present disclosure, which includes a communication module 110, a waveform output module 120, a waveform data storage module 130, a time delay module 140 and a clock management module 150.

The clock management module 150 is configured to distribute clock to the entire system to synchronize the working clock of the entire system. An external high stability clock source may be connected to the module as a reference.

The communication module 110, as a communication bridge between a host computer and the sequence signal generator, establishes a data connection between the host computer and the waveform output module. The communication module 110 transmits, when receiving an instruction sent by the host computer 100, the instruction to the waveform output module 120.

The communication module 110 may transmit the following content: instructions for controlling and configuring the sequence signal generator, and waveform data.

The waveform output module 120 is configured to control the data and operating status of the entire system. The waveform output module 120 receives an instruction sent by the host computer through the communication module and performs a corresponding action.

The waveform data storage module 130 stores waveform data sent by the host computer. The waveform data includes original square wave sequence data and target square wave sequence data.

The waveform output module 120, when determining that the received instruction is a waveform output instruction, parses the instruction to acquire the storage address of the waveform data, and reads waveform data from the waveform data storage module 130 according to the storage address. The waveform data includes original square wave sequence data and target square wave sequence data. Then, the waveform output module 120 generates an original square wave sequence signal according to the original square wave sequence data, and transmits the original square wave sequence signal and the target square wave sequence data to the time delay module 140.

The target square wave sequence data includes a preliminary delay parameter and a secondary delay parameter. The preliminary delay parameter is used to determine the number of stages of the preliminary delay units to be used for delay, and the secondary delay parameter is used to determine the number of stages of the secondary delay units to be used for delay.

In an embodiment of the present disclosure, waveform data generally includes a set of high level data and a set of low level data. The high level data includes high level hold time, a rising-edge preliminary delay stage number, and a rising-edge secondary delay stage number. The low level data includes low level hold time, a falling-edge preliminary delay stage number, and a falling-edge secondary delay stage number.

The high level hold time and the low level hold time are included in the original square wave sequence data. The preliminary delay parameter in the target square wave sequence data includes the rising-edge preliminary delay stage number and the falling-edge preliminary delay stage number. The secondary delay parameter in the target square wave sequence data includes the rising-edge secondary delay stage number and the falling-edge secondary delay stage number.

The high level hold time and the low level hold time are respectively represented as the numbers of the system clock cycles during which a high level and a low level is held, which are denoted as $N_H$ and $N_L$. The waveform output module 120 generates an original square wave sequence signal according to the system clock cycle, $N_H$ and $N_L$.

The rising-edge preliminary delay stage number $N_{L1}$ and the falling-edge preliminary delay stage number $N_{H1}$ are respectively the numbers of preliminary delay units passed by the rising edge and the falling edge of the original square wave sequence signal.

The rising-edge secondary delay stage number $N_{L2}$ and the falling-edge secondary delay stage number $N_{H2}$ are respectively the numbers of secondary delay units passed by the rising edge and the falling edge of the intermediate square wave sequence signal.

In another embodiment of the present disclosure, if the waveform output module 120 determines that the received instruction is a waveform storage instruction, the waveform data received by the host computer 100 through the communication module 110 is stored in the waveform output module 120.

The time delay module 140 includes at least one preliminary delay unit and at least one secondary delay unit. The delay time of the preliminary delay unit is greater than the delay time of the secondary delay unit, and the delay time of the secondary delay unit is less than the system clock cycle.

If the delay time of each preliminary delay unit is represented as t1, the delay time of each secondary delay unit is represented as t2, and the system clock cycle is represented as T, then t2<t1<T.

The preliminary delay unit performs a preliminary delay processing on the original square wave sequence signal according to the preliminary delay parameter to acquire an intermediate square wave sequence signal, and transmit the intermediate square-wave sequence signal to the secondary delay unit. The secondary delay units performs a secondary delay processing on the intermediate square wave sequence signal according to the secondary delay parameter to acquire a target square wave sequence signal, and outputs the target square wave sequence signal.

Figure 2:
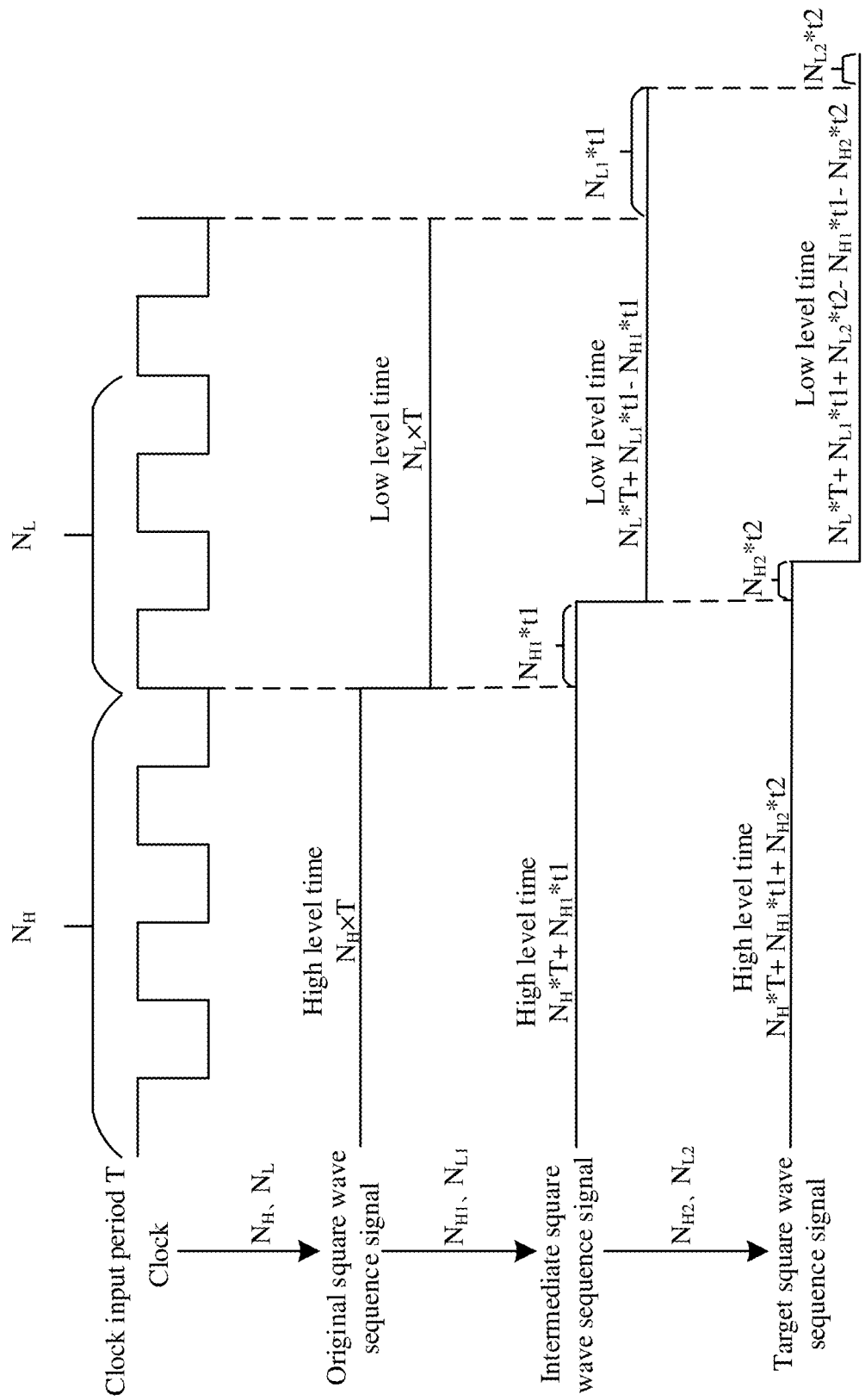
FIG. 2 is a schematic diagram of a square wave sequence signal at various steps in a process of generating a target square wave sequence signal according to an embodiment of the present disclosure.

The following describes a process of generating a target square wave sequence signal with reference to FIG. 2.

The generation process of the original sequence signal is as follows. The waveform output module 120 records the number of clock cycles during which a high level signal or a low level signal is held, and switches the level signals on the edge of the system clock. For example, when a high level signal is outputted and is held for a time of $N_H$ clock cycles, the output signal is switched to be a low-level signal at the edge of the system clock, that is, the high level is held for the time of $N_H \times T$. When a low level signal is outputted and is held for a time of $N_L$ clock cycles, the output signal is switched to be a high level signal at the edge of the system clock, that is, the low level is held for the time of $N_L \times T$. New waveform data may be read, and by repeating the above process, the original sequence signal is generated finally.

The intermediate square wave sequence signal is generated as follows. The intermediate square wave sequence signal is generated by delaying the original sequence signal by multiple preliminary delay units. If the delay time of each preliminary delay unit is represented as t1, and the falling edge of the original square wave sequence signal passes through $N_{H1}$ preliminary delay units, the delay time of the falling edge signal is $N_{H1} \times t1$. If the rising edge of the original square wave sequence signal passes through $N_{L1}$ preliminary delay units, the delay time of the rising edge signal is $N_{L1} \times t1$.

The target square wave sequence signal is generated as follows. The target square wave sequence signal is generated by delaying the intermediate sequence signal by multiple secondary delay units. If the delay time of each second order delay unit is represented as t2, and the falling edge of the intermediate square wave sequence signal passes through $N_{H2}$ secondary delay units, the delay time of the falling edge signal is $N_{H2} \times t2$. If the rising edge of the intermediate square wave sequence signal passes through $N_{L2}$ secondary delay units, the delay time of the rising edge signal is $N_{L2} \times t2$.

In an embodiment of the present disclosure, the waveform data stored in the waveform data storage module is calculated by the host computer according to the parameters of the target square wave sequence signal to be outputted, and is stored in the waveform data storage module by the host computer.

The following describes a process of outputting a high level signal (or a low level signal) in the target square wave sequence signal as an example.

The high level hold time (or low level hold time) of the target square wave sequence signal, the system clock cycle T, the delay time of the preliminary delay unit, and the delay time of the secondary delay unit are used to calculate the high level hold time and low level hold time in the original square wave sequence signal, which is represented as N, the number of stages of the preliminary delay units passed by the rising edge (or falling edge) which is represented as N1, and the number of stages of the secondary delay units passed by the rising edge (or falling edge), which is represented as N2. These three pieces of data are stored as waveform data in the waveform data storage module.

The position t0, on the time axis, of the edge of the target square wave sequence signal generated by the sequence signal generator based on the waveform data depends on the system clock cycle T, the high level (or low level) hold time N, the number of stages N1 of the preliminary delay units passed by the rising edge (or falling edge) and the number of stages N2 of the secondary delay units passed by the rising edge (or falling edge), that is, t0 may be expressed by the following formula 1:

$$t0 = N \times T + N1 \times t1 + N2 \times t2 \quad \text{(Formula 1)}$$

In Formula 1, t1 represents the delay time of each preliminary delay unit, t2 represents the delay time of each secondary delay unit, T represents the system clock cycle, and t2<t1<T.

Limited by the current manufacturing process, there is a certain deviation between the actual delay of the time delay unit and its rated delay. Furthermore, it is difficult to control the deviation of a time delay unit having a small delay time parameter. For a delay chain composed of multiple secondary delay units, the deviation will cause a non-linearity of the delay chain. A large deviation will result in a great non-linearity of the delay chain.

A delay chain usually has a section of low non-linearity and a section of high non-linearity. A long delay chain usually causes great difficulty for controlling the non-linearity. The section of small non-linearity of the delay chain can be determined by counting the real time delay of each secondary delay unit in the delay chain composed of multiple secondary delay units. Then, the preliminary delay units are used to replace some secondary delay units, thereby reducing the number of used secondary delay units. That is, the length of the delay chain composed of the secondary delay units is reduced, so that the used time-delay chain falls in the section of favorable non-linearity. Therefore, the effect on the time precision of the square wave sequence signal caused by the section of high non-linearity of the delay chain is eliminated, and thus the time precision of the square wave sequence signal is improved.

The use of the preliminary delay units can only shorten the length of the delay chain to avoid using the back section of non-favorable non-linearity in the delay chain. If the section of favorable non-linearity in the delay chain is located in the middle of the delay chain, and the section of the used delay chain falls before the section of favorable non-linearity, all secondary delay parameters in the waveform data to be output are uniformly adjusted, that is, the length of the delay chain composed of the secondary delay units is adjusted, so that the finally used delay chain falls into the section of favorable non-linearity.

It is assumed that the section of low non-linearity of the delay chain is from the (m+1)-th stage to the (m+q)-th stage. At this time, the host computer may add a fixed delay X×t2 on the basis of the calculated number of stages N2 of the secondary delay units required to generate the target square wave sequence signal, so that all N2 in the target square wave sequence signal satisfy m+1≤N2+X≤m+q. Then N2 of Formula 1 is adjusted to N2+X. N, N1 and N2+X are the number of stages of the secondary delay units calculated by the host computer.

For example, the host computer calculates N2=2, m=3, and q=7 in Formula 1, that is, the section of low non-linearity of the delay chain composed of the secondary delay units is from the 4-th stage to the 10-th stage. It is assumed that when 2≤X≤8, all N2 in the target square wave sequence signal can satisfy 4≤N2+X≤10. For example, if X=4, then N2+X=6, and the calculated N2 is adjusted to 6 as the final N2.

As the fixed delay is added for each high level and low level, the rising and falling edges are all delayed by the fixed delay, while the high level hold time and low level hold time are not changed. It is equivalent to moving the start time of the waveform without affecting the waveform of the square wave sequence signal. Therefore, by adjusting the number of stages of the used secondary delay units, it is achieved to only use the secondary delay units with low non-linearity, thereby eliminating effect on the target square wave sequence signal caused by the section of high non-linearity in the delay chain composed of secondary delay units, and thus improving the time precision of the target square wave sequence signal.

The sequence signal generator provided in this embodiment uses the preliminary delay unit and the secondary delay unit having different delay time parameters to sequentially perform the time delay processing on the original sequence signal to acquire a target square wave sequence signal. By adjusting the number of used preliminary delay units, only the section of low non-linearity of the delay chain composed of secondary delay units is used, that is, the effect on the time precision of the square wave sequence signal caused by the section of high non-linearity of the delay chain is eliminated, and thus the time precision of the square wave sequence signal is improved.

Figure 3:
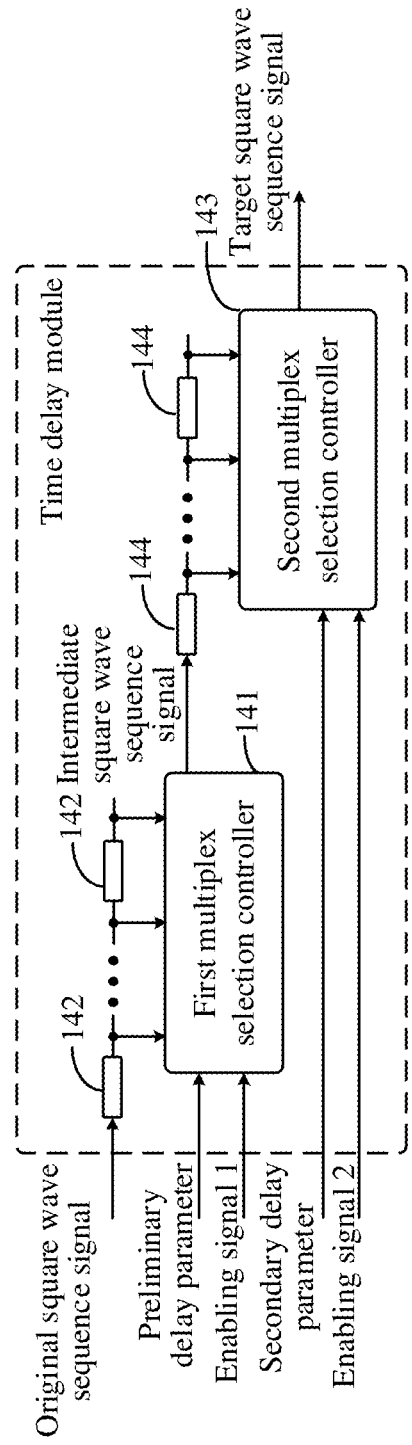
FIG. 3 is a structural block diagram of a time delay module according to an embodiment of the disclosure.

FIG. 3 shows a structural block diagram of a time delay module according to an embodiment of the present disclosure. The time delay module includes a first multiplex selection controller 141, multiple preliminary delay units 142, a second multiplex selection controller 143 and multiple secondary delay units 144.

The preliminary delay units 142 are configured to perform a preliminary delay processing on the received original sequence signal. The delay time of each preliminary delay unit is t1.

The first multiplex selection controller 141 is configured to determine an output node for the original square wave sequence signal in the preliminary delay units according to the preliminary delay parameter, and acquire an intermediate square wave sequence signal as the signal outputted by the output node.

As shown in FIG. 3, the first multiplex selection controller 141 includes a selection terminal, two input terminals, and an output terminal. One of the input terminals is used to input the preliminary delay parameter, and the other of the input terminals is used to input an enabling signal. Only when the enabling signal is valid, the preliminary delay parameter can be loaded into the first multiplex selection controller 141. The first multiplex selection controller 141 is configured to determine the preliminary delay unit to be connected to the selection terminal according to the preliminary delay parameter, and output at the output terminal an intermediate square wave sequence signal acquired by delaying through the preliminary delay units.

The preliminary delay parameter includes the falling-edge preliminary delay stage number $N_{H1}$ and the rising-edge preliminary delay stage number $N_{L1}$. The first multiplex selection controller 141 determines an output position of the rising edge of the original square wave sequence signal in the multiple secondary delay units according to $N_{L1}$, that is, a first output node; and also determines an output position of the falling edge of the original square wave sequence signal in the multiple preliminary delay units according to $N_{H1}$, that is, a second output node. After the original signal passes the first output node or the second output node of the preliminary delay units, an intermediate square wave sequence signal is acquired and outputted through the output terminal of the first multiplex selection controller 141.

The secondary delay units 144 are configured to perform a secondary delay processing on the intermediate square wave sequence signal outputted by the first multiplex selection controller 141.

The delay time of each secondary delay unit is t2, where t2<t1<T, and T is the system clock cycle.

The second multiplex selection controller 143 is configured to determine an output node of the intermediate square wave sequence signal in the secondary delay units according to the secondary delay parameter, and acquire a target square wave sequence signal at the output node.

The second multiplex selection controller 143 includes a selection terminal, a data input terminal, and an enabling terminal. Only when the enabling signal input at the enabled terminal is valid, the secondary delay parameter at the data input terminal can be loaded into the secondary selection controller 143. The second multiplex selection controller 143 determines the secondary delay unit to be connected to the selection terminal according to the secondary delay parameter. The target square wave sequence signal acquired by delaying through the secondary delay units is outputted at the output terminal of the multiplex selection controller 143.

The secondary delay parameter includes a rising-edge secondary delay stage number and a falling-edge secondary delay stage number. The second multiplex selection controller 143 determines an output position for the intermediate square wave sequence signal in the multiple secondary delay units according to the rising-edge secondary delay stage number, that is, a third output node. Also, the second multiplex selection controller 143 determines an output position for the intermediate square wave sequence signal in the multiple secondary delay units according to the falling-edge secondary delay stage number, that is, a fourth output node. The target square wave sequence signal is acquired as the intermediate square wave sequence signal passing through the third output node or the fourth output node of the secondary delay units, and is outputted at the output terminal of the second multiplex selection controller 143.

The sequence signal generator provided in this embodiment uses two multiplex selection controllers to control the number of the preliminary delay units and the secondary delay units respectively, to achieve precise control of the preliminary delay processing and the secondary delay processing, so as to generate a square wave sequence signal with higher time precision. Moreover, the sequence signal generator can achieve the precise adjustment of the pulse width of the square wave sequence signal only by configuring the time delay module before the rising or falling edges of each square wave sequence signal arrives. Therefore, dead time is only a few clock cycles, which is only in the order of nanosecond in the case of using a high-speed clock. Dead time is the time during which the pulse width in a square wave sequence signal cannot be changed. A short dead time indicates a small minimum pulse width of the square wave sequence signal.

In another embodiment of the present disclosure, in order to further improve the time precision of the sequence signal generator, for a known target square wave sequence signal, each set of possible waveform data (for example, N, N1, and N2) are calibrated with the corresponding real delay to find a set of waveform data (for example, N', N1', and N2') having the smallest error with the target square wave sequence signal to be output, which are used as the waveform data correction values, so that the waveform output module reads the waveform data correction values and generates a corresponding target square wave sequence signal according to the waveform data correction values.

Formula 1 is a formula for calculating the position t0 of the edge of the target square wave sequence signal on the time axis without considering the non-linearity of the preliminary delay units. When considering the non-linearity of both the preliminary delay units and the secondary delay units, the signal that falls outside the linear section of the secondary delay units is folded into the linear section. This process can be expressed by Formula 2:

$$t0 = N \times T + (N1-i) \times t1 + (N2+i \times q) \times t2 \quad \text{(Formula 2)}$$

where $t2 < t1 < T$, $0 \le i \le N1$, $t1 = q \times t2$, and q is a positive integer.

Because deviation exists in both the preliminary delay units and the secondary delay units, different parameter combinations of t0 in Formula 2 result in different actual delays, which are distributed around the ideal time t00. The time interval between the actual delays may be less than the delay time of each secondary delay unit, i.e., t2, and therefore the obtained control precision of the sequence signal time is less than t2.

Moreover, by adjusting the value of i, a value can always be find to meet the condition that, for all waveform data, $m+1 \le N2+i \times q \le m+q$ is met and the deviation between the actual time t0 and the ideal time t00 is the smallest. In this case, N1 is adjusted to N1−i, and N2 is adjusted to N2+i×q. The sequence signal generator takes N, N1−i, and N2+i×q as the correction values to generate the target square wave sequence signal.

In an embodiment of the present disclosure, calibration is performed for each set of waveform data (for example, N, N1, N2) to find a set of waveform data correction values (for example, N, N1−i, N2+i×q) and the waveform data is stored in correspondence with the waveform data correction values. After acquiring a set of waveform data (for example, N, N1, N2) according to the square wave sequence signal required by the user to be outputted, N, N1, N2 can be used as a search key to perform search to acquire the corresponding correction values N, N1−i, N2+i×q, which are used to generate the final square wave sequence signal. Therefore, the time precision of the square signal sequence signal generated by the sequence signal generator is further improved.

Based on the above-mentioned embodiments of the sequence signal generator, an embodiment of a method for generating a sequence signal is further provided in the present disclosure.

Figure 4:
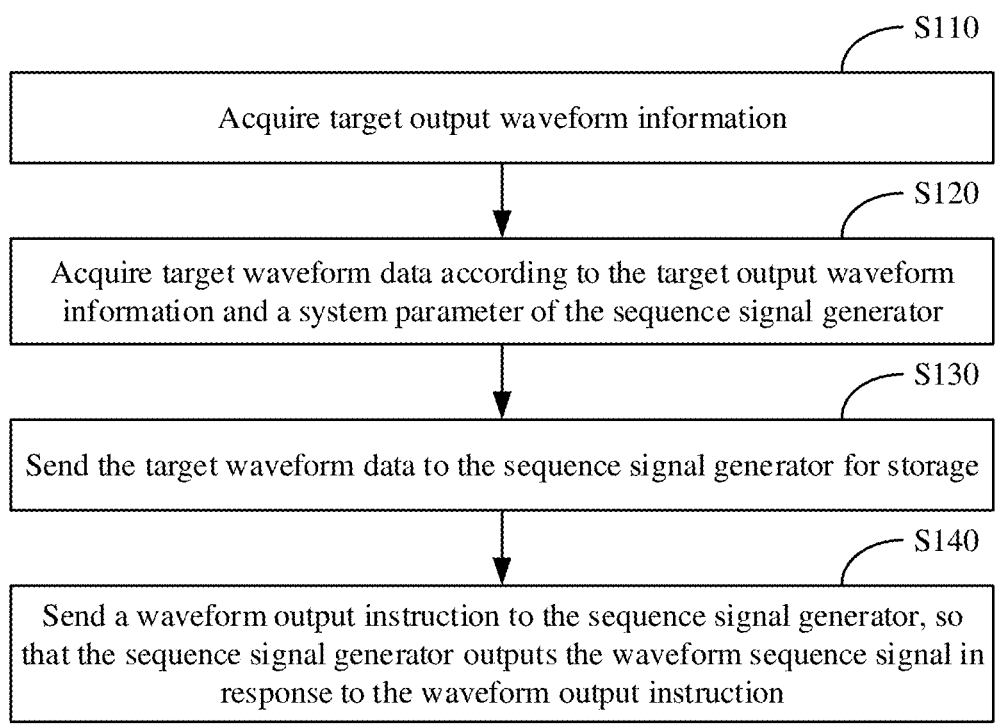
FIG. 4 is a flowchart of a sequence signal generation method according to an embodiment of the present disclosure.

FIG. 4 shows a flowchart of a method for generating a sequence signal according to an embodiment of the present disclosure, which is applied to a host computer. In this embodiment, the host computer calculates the target waveform data according to the sequence signal information required by the user to be outputted and a system parameter of the sequence signal generator, and sends the target waveform data to the sequence signal generator.

As shown in FIG. 4, the method may include the following steps S110 to S140.

In step S110, target output waveform information is acquired.

The target output waveform information is a target sequence signal waveform that the user wants to output, which includes at least one set of waveform data. For example, a set of waveform data may include high level data and low level data.

In step S120, target waveform data is acquired according to the target output waveform information and the system parameter of the sequence signal generator.

The target waveform data includes original square wave sequence data and target square wave sequence data.

The system parameter of the sequence signal generator includes the system clock cycle, the delay time of the preliminary delay unit, and the delay time of the secondary delay unit. The delay time of the preliminary delay unit is greater than that of the secondary delay unit. Both the delay time of the preliminary delay unit and the delay time of the secondary delay unit are less than the system clock cycle.

The following describes the process of acquiring the target square wave sequence data with a simple example. For example, the target output waveform information includes a high level hold time and a low level hold time. A quotient obtained by dividing the high level hold time by the system clock cycle is the high level hold time in the original square wave sequence data. If a first remainder is obtained by the dividing by the system clock cycle, the first remainder is divided by the delay time of the preliminary delay unit to acquire a quotient as a preliminary delay parameter. If a second remainder is obtained by the dividing by the delay time of the preliminary delay units, the second remainder is divided by the delay time of the secondary delay unit to acquire a quotient as a secondary delay parameter.

Similarly, the original square wave sequence data, preliminary delay parameter, and secondary delay parameter for the low level may be calculated by using the foregoing process, and details are not described herein again.

In an embodiment of the present disclosure, S120 may include the following steps A to C.

In step A, the original square wave sequence data, the preliminary delay parameter and an initial secondary delay parameter are calculated according to the target square wave waveform information and the system parameter.

In step B, it is determined whether the initial secondary delay parameter is in a preferred parameter range;

The preferred parameter range is a range of stages having low non-linearity in the delay chain composed of the secondary delay units of the sequence signal generator. The preferred parameter range may be acquired by counting the real delay of each secondary delay unit in the delay chain composed of the secondary delay units.

In step C, the initial secondary delay parameter is increased by a specified delay to acquire the secondary delay parameter if the initial secondary delay parameter is less than the minimum value of the preferred parameter range, so that each secondary delay parameter in the target waveform data is in the preferred parameter range.

If the calculated initial secondary delay parameter is less than the minimum value of the preferred parameter range, it indicates that the initial secondary delay parameter is before the section of favorable non-linearity of the delay chain. In this case, a fixed delay is added to the initial secondary delay parameters of all waveform data, so that all secondary delay parameters in the target waveform data are in the preferred parameter range.

As a fixed delay is added for each high level and low level, the rising and falling edges are delayed by a fixed delay, while the high level hold time and low level hold time are not changed. Therefore, it is equivalent to moving the start time of the waveform without affecting the waveform of the square wave sequence signal.

In step S130, the target waveform data is sent to the sequence signal generator for storage.

The host computer sends a storage instruction and the waveform data to be stored. The sequence signal generator receives the storage instruction and the waveform data to be stored, and stores the waveform data in the waveform data storage.

In a preferred embodiment of the present disclosure, in order to further improve the time precision of the sequence signal, for a known target square wave sequence signal, each set of possible waveform data (for example, N, N1, and N2) are calibrated with the corresponding real delay to find a set of waveform data (for example, N', N1', and N2') having the smallest error with the target square wave sequence signal to be output, which are stored in the host computer as the waveform data correction values, so that the sequence signal generator can acquire the waveform data correction values and generate a corresponding target square wave sequence signal according to the waveform data correction values.

In step S140, a waveform output instruction is sent to the sequence signal generator, to control the sequence signal generator to output the waveform sequence signal in response to the waveform output instruction.

The sequence signal generator acquires the target waveform data from the received waveform output instruction. The target waveform data includes the original square wave sequence data and the target square wave sequence data, and the target square wave sequence data includes the preliminary delay parameter and the secondary delay parameter. Then, the sequence signal generator generates the original square wave sequence signal according to the original square wave sequence data, and performs a preliminary delay processing on the original square wave sequence signal according to the preliminary delay parameter to acquire an intermediate square wave sequence signal, and then performs a secondary delay processing on the intermediate square wave sequence signal according to the secondary delay parameter to acquire a target square wave sequence signal.

The sequence signal generation method provided in this embodiment uses the preliminary delay unit and the secondary delay unit having different delay time parameters to sequentially perform time delay processing on the original sequence signal to acquire a target square wave sequence signal. By adjusting the number of preliminary delay units used, only the section of low non-linearity of the delay chain composed of secondary delay units is used, that is, the effect on the time precision of the square wave sequence signal caused by the section of high non-linearity of the delay chain is eliminated, and thus the time precision of the square wave sequence signal is improved.

Figure 5:
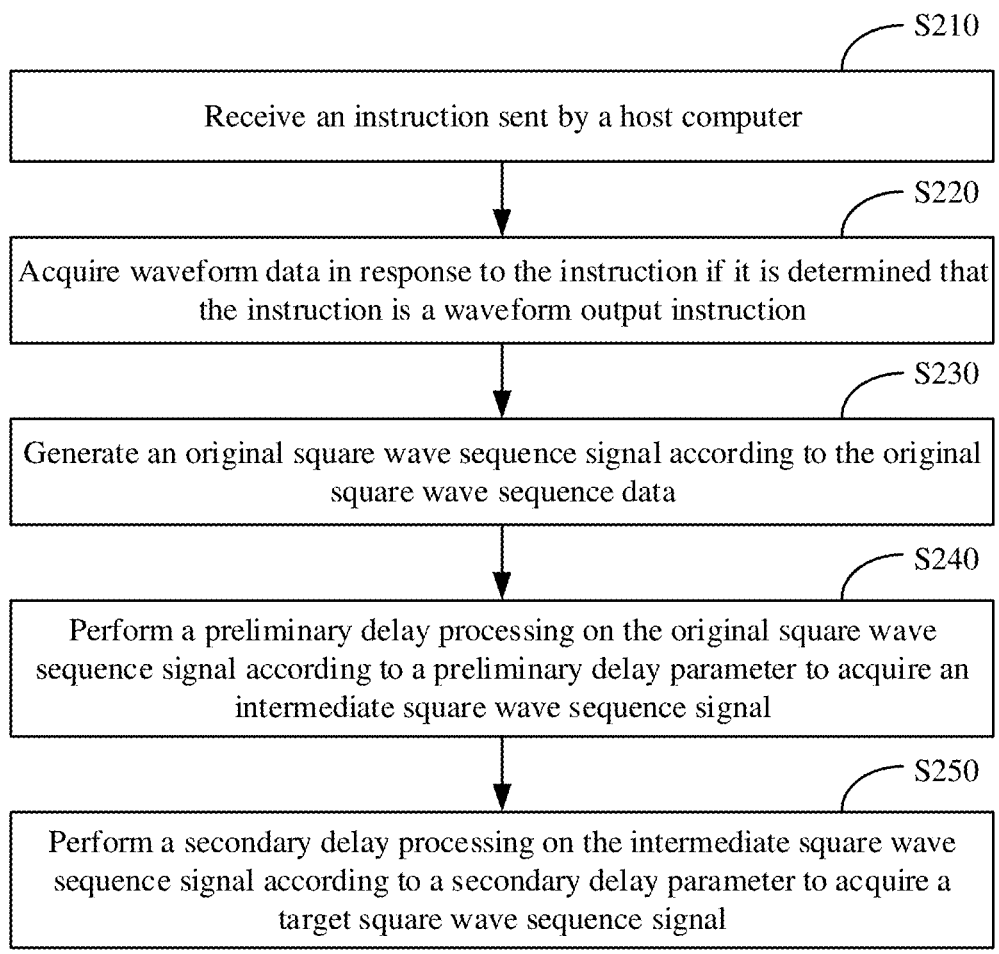
FIG. 5 is a flowchart of another sequence signal generation method according to an embodiment of the present disclosure.

FIG. 5 shows a flowchart of another method for generating a sequence signal according to an embodiment of the present disclosure. The method is applied to a sequence signal generator. As shown in FIG. 5, the method may include the following steps S210 to S250.

In step S210, an instruction sent by a host computer is received.

The instruction sent by the host computer is received through the communication module. After receiving the instruction, the type of the instruction is determined, and a corresponding action is performed according to the type of the instruction.

In an embodiment of the present disclosure, after receiving the instruction, the sequence signal generator first determines whether the instruction is an error instruction. If it is an error instruction, the sequence signal generator does not perform any processing and waits to receive the next instruction. If it is not an error instruction, the sequence signal generator determines the instruction type. The instruction type may include a waveform output instruction, a waveform storage instruction, or a data verification instruction, and the like.

If the received instruction is determined as a waveform storage instruction, the received waveform data is stored in the waveform data storage module in the sequence signal generator.

If the received instruction is determined as a data verification instruction, the waveform data is read from the waveform data storage module and transmitted back to the host computer, to be verified by the host computer.

If the received instruction is determined as a waveform output instruction, step S220 is performed.

In step S220, if it is determined that the instruction is a waveform output instruction, waveform data is acquired in response to the instruction.

The waveform data includes original square wave sequence data and target square wave sequence data, and the target square wave sequence data includes preliminary delay parameter and secondary delay parameter.

If the received instruction is a waveform output instruction, the waveform output instruction is parsed to acquire a waveform data storage address, and the corresponding waveform data are read from the waveform data storage module of the sequence signal generator.

In an embodiment of the present disclosure, after the waveform data is acquired, it is determined whether the data format of the waveform data is correct. If the data format is correct, step S230 is performed, and if the data format is incorrect, the sequence signal generator waits to receive the next instruction.

In a preferred embodiment of the present disclosure, in order to further improve the time precision of the sequence signal, for a known target square wave sequence signal, each set of possible waveform data (for example, N, N1, and N2) are calibrated with the corresponding real delay to find a set of waveform data (for example, N', N1', and N2') having the smallest error with the target square wave sequence signal to be output, which are stored in the sequence signal generator as waveform data correction values. The sequence signal generator reads the waveform data correction values and generates a target square wave sequence signal according to the waveform data correction values.

In step S230, an original square wave sequence signal is generated according to the original square wave sequence data.

In step S240, a preliminary delay processing is performed on the original square wave sequence signal according to the preliminary delay parameter to acquire an intermediate square wave sequence signal.

In step S250, a secondary delay processing is performed on the intermediate square wave sequence signal according to the secondary delay parameter to acquire a target square wave sequence signal.

For details of steps S230 to S250, one may refer to the relevant part in the above embodiments of the sequence signal generator.

After performing steps S220 to S250 once, a piece of waveform data is outputted. Then it is determined whether the waveform output is completed. If the waveform output is not completed, step S220 is performed to read the next waveform data. The process is repeated until all the waveform data are outputted. If the waveform output ends, the sequence signal generator waits to receive the next instruction.

The sequence signal generation method provided in this embodiment uses the preliminary delay unit and the secondary delay unit having different delay time parameters to sequentially perform time delay processing on an original sequence signal to acquire a target square wave sequence signal. By adjusting the number of used preliminary delay units, only the section of low non-linearity of the delay chain composed of secondary delay units is used, that is, the effect on the time precision of the sequence signal caused by the section of high non-linearity of the delay chain is eliminated, and thus the time precision of the square wave sequence signal is improved.

For the sake of simple description, the foregoing method embodiments are all described as a series of actions, but those skilled in the art should understand that the present disclosure is not limited to the described sequence of actions, because according to the present disclosure, some steps may be performed in other sequences or simultaneously. Secondly, those skilled in the art should understand that the embodiments described in the specification are all preferred embodiments, and the involved actions and modules may not be necessary.

For the sake of simple description, the foregoing method embodiments are all described as a series of actions, but those skilled in the art should understand that the present disclosure is not limited to the described sequence of actions, because according to the present disclosure, some steps may be performed in other sequences or simultaneously. Secondly, those skilled in the art should understand that the embodiments described in the specification are all preferred embodiments, and the involved actions and modules may not be necessary.

It should be noted that the embodiments of the present disclosure are described in a progressive manner. Each embodiment focuses on the differences from other embodiments. For the same and similar parts between the various embodiments, reference may be made one to another. As for the device embodiment, since it is basically similar to the method embodiment, the description is relatively simple. For the relevant part, one may refer to the description of the method embodiment.

The steps in the methods of the embodiments of the present disclosure can be adjusted, combined, and deleted according to actual needs.

Modules and sub-modules in the devices and terminals of the embodiments of the present disclosure can be combined, divided, and deleted according to actual needs.

In the embodiments provided in this disclosure, it should be understood that the disclosed terminals, devices, and methods may be implemented in other manners. For example, the terminal embodiments described above are only schematic. For example, the division of modules or sub-modules is only a logical function division. In actual implementation, there may be another division manner. For example, multiple sub-modules or modules may be combined or may be integrated into another module, or some features can be omitted or not implemented. In addition, the displayed or discussed mutual coupling or direct connection or communication connection may be indirect coupling or communication connection through some interfaces, devices or modules, which may be electrical, mechanical or in other forms.

Modules or sub-modules described as separate components may or may not be physically separated, and components of modules or sub-modules may or may not be physical modules or sub-modules, which may be located in one place or distributed to multiple network modules or sub-modules. Some or all of the modules or sub-modules may be selected according to actual needs to achieve the objective of the solution of this embodiment.

In addition, each functional module or sub-module in each embodiment of the present disclosure may be integrated into a same processing module, or may exist as separated physical modules or sub-modules, or two or more modules or sub-modules may be integrated into one module. The above integrated modules or sub-modules may be implemented in the form of hardware or software functional modules or sub-modules.

In the practices, the application program control device described in the foregoing embodiment may be integrated into an electronic device, which may be a mobile device such as a mobile phone or a tablet computer. The electronic equipment in which the application program control device of the embodiment of the present disclosure is deployed can quickly and efficiently control the application program, reducing tedious operation steps, and thus reducing the number of times the user operates the electronic equipment, thereby reducing the calculation amount of the electronic equipment, which helps improving the performance of electronic devices.

The embodiments of the present disclosure are described in a progressive manner. Each embodiment focuses on the differences from other embodiments. For the same and similar parts between the embodiments, reference may be made one to another. For the device disclosed in the embodiment, since it corresponds to the method disclosed in the embodiment, the description is relatively simple, and for the relevant part, one may refer to the description of the method.

Finally, it should be noted that in the present disclosure, relational terms such as "first" and "second" are used only to distinguish one entity or operation from another entity or operation, and do not necessarily require or imply that there is any such actual relationship or order for these entities and operations. Moreover, the terms "comprising", "including", or any other variation are intended to encompass non-exclusive inclusion, such that a process, method, article, or device that includes a series of elements includes not only those elements but also those that are not explicitly listed, or other elements inherent to such a process, method, article, or device. Without more restrictions, the elements defined by the sentence "comprising a . . . " do not exclude the existence of other identical elements in the process, method, article, or equipment comprising the elements.

For the convenience of description, when describing the above device is described as various units divided in terms of the functions. Apparently, in implementations, the functions of the units may be implemented in the same or multiple software and/or hardware.

From the description of the foregoing embodiments, those skilled in the art can clearly understand that the present disclosure can be implemented by means of software with a necessary universal hardware platform. Based on this understanding, the technical solution of this disclosure which is essential or contributes to the existing technology can be embodied in the form of a software product, which can be stored in a storage medium, such as ROM/RAM, magnetic disk, optical discs, and the like, including a number of instructions for a computer device (which may be a personal computer, a server, or a network device, etc.) to execute the method described in each embodiment or some parts of the disclosure.

By reading the above description of the disclosed embodiments, those skilled in the art can implement or use the present disclosure. Various modifications to these embodiments are apparent to those skilled in the art, and the general principles defined herein may be implemented in other embodiments without departing from the spirit or scope of the disclosure. Therefore, this disclosure are not limited to the embodiments shown herein, but should conform to the widest scope consistent with the principles and novel features disclosed herein.

The invention claimed is:

1. A sequence signal generator, comprising:
   a communication module,
   a waveform output module,
   a waveform data storage module, and
   a time delay module, wherein
   the time delay module comprises at least one preliminary delay unit and at least one secondary delay unit, and a delay time of the preliminary delay unit is greater than a delay time of the secondary delay unit, and the delay time of the preliminary delay unit and the delay time of the secondary delay unit are both less than a system clock cycle;
   the communication module is configured to receive an instruction sent by a host computer and transmit the instruction to the waveform output module;
   the waveform output module is configured to, in a case of determining the instruction as a waveform output instruction, read waveform data from the waveform data storage module in response to the instruction, wherein the wave data comprises original square wave sequence data and target square wave sequence data; generate an original square wave sequence signal based on the original square wave sequence data; and transmit the original square wave sequence signal and the target square wave sequence data to the time delay module, wherein the target square wave sequence data comprises a preliminary delay parameter and a secondary delay parameter; and
   the time delay module is configured to perform a preliminary delay processing on the original square wave sequence signal by the at least one preliminary delay unit according to the preliminary delay parameter to acquire an intermediate square wave sequence signal, perform a secondary delay processing on the intermediate square wave sequence signal by the at least one secondary delay unit according to the secondary delay parameter to acquire a target square wave sequence signal, and output the target square wave sequence signal.

2. The sequence signal generator according to claim 1, wherein
   the time delay module further comprises a first multiplex selection controller and a second multiplex selection controller;
   the at least one preliminary delay unit is configured to perform the preliminary delay processing on the original square wave sequence signal;
   the first multiplex selection controller is configured to determine an output node for the original square wave sequence signal in the at least one preliminary delay unit according to the preliminary delay parameter, and acquire the intermediate square wave sequence signal at the output node;
   the at least one secondary delay unit is configured to perform the secondary delay processing on the intermediate square wave sequence signal; and the second multiplex selection controller is configured to determine an output node for the intermediate square wave sequence signal in the at least one secondary delay unit according to the secondary delay parameter, and acquire the target square wave sequence signal at the output node.

3. The sequence signal generator according to claim 2, wherein
the preliminary delay parameter comprises a rising-edge preliminary delay stage number and a falling-edge preliminary delay stage number, and the secondary delay parameter comprises a rising-edge secondary delay stage number and a falling-edge secondary delay stage number;
the first multiplex selection controller is configured to determine a first output node for a rising edge of the original square wave sequence signal in the at least one preliminary delay unit according to the rising-edge preliminary delay stage number, and determine a second output node for a falling edge of the original square wave sequence signal in the at least one preliminary delay unit according to the falling-edge preliminary delay stage number; the intermediate square wave sequence signal is acquired as the original square wave sequence signal passing through the first output node or the second output node of the at least one preliminary delay unit; and
the second multiplex selection controller is configured to determine a third output node for a rising edge of the intermediate square wave sequence signal in the at least one secondary delay unit according to the rising-edge secondary delay stage number, and determine a fourth output node for a falling edge of the intermediate square wave sequence signal in the at least one secondary delay unit according to the falling-edge secondary delay stage number; the target square wave sequence signal is acquired as the intermediate square wave sequence signal passing through the third output node or the fourth output node of the at least one secondary delay unit.

4. The sequence signal generator according to claim 1, wherein
the waveform data storage module is further configured to store a waveform data correction value corresponding to the waveform data, a deviation between a square wave sequence signal corresponding to the waveform data correction value and the target square wave sequence signal corresponding to the waveform data is minimal, the waveform data correction value comprises a correction value of the original square wave sequence data and a correction value of the target square wave sequence data;
the waveform output module is further configured to search for, from the waveform storage module, the waveform data correction value corresponding to the waveform data, generate the original square wave sequence signal according to the correction value of the original square wave sequence data, and transmit the original square wave sequence signal and the correction value of the target square wave sequence data to the time delay module, wherein the correction value of the target square wave sequence data comprises a preliminary delay parameter correction value and a secondary delay parameter correction value; and
the time delay module is further configured to perform the preliminary delay processing on the original square wave sequence signal according to the preliminary delay parameter correction value by the preliminary delay unit to acquire the intermediate square wave sequence signal, and perform the secondary delay processing on the intermediate square wave sequence signal according to the secondary delay parameter correction value to acquire the target square wave sequence signal, and output the target square wave sequence signal.

5. The sequence signal generator according to claim 1, wherein the original square wave sequence data comprises a high level hold time and a low level hold time, the high level hold time is represented as a number of the system clock cycles during which a high level is held, and the low level hold time is represented as a number of the system clock cycles during which a low level is held; and
the waveform output module is configured to generate the original square wave sequence signal based on the original square wave sequence data by:
generating a high level signal and holding the high level signal for the high level hold time; and switching to generate a low level signal and holding the low level signal for the low level hold time.

6. The sequence signal generator according to claim 1, wherein the waveform output module is further configured to store the waveform data received through the communication module into the waveform data storage module in a case that the instruction is a waveform storage instruction.

7. The sequence signal generator according to claim 1, wherein a quantity of the at least one preliminary delay unit is determined so that a delay chain composed of the at least one secondary delay unit is in a section of low non-linearity.

8. A sequence signal generation method, comprising:
acquiring target output waveform information;
acquiring target waveform data according to the target output waveform information and a system parameter of a sequence signal generator, wherein the target waveform data comprises original square wave sequence data and target square wave sequence data, the system parameter comprises a system clock cycle, a delay time of a preliminary delay unit and a delay time of a secondary delay unit, wherein the delay time of the preliminary delay unit is greater than the delay time of the secondary delay unit, and the delay time of the preliminary delay unit and the delay time of the secondary delay unit are both less than the system clock cycle;
sending the target waveform data to the sequence signal generator for storage; and
sending a waveform output instruction to the sequence signal generator, to control the sequence signal generator to acquire the target waveform data in response to the waveform output instruction, generate an original square wave sequence signal according to the original square wave sequence data, perform a preliminary delay processing on the original square wave sequence signal according to a preliminary delay parameter in the target square wave sequence data to acquire an intermediate square wave sequence signal, and perform a secondary delay processing on the intermediate square wave sequence signal according to a secondary delay parameter in the target square wave sequence data to acquire a target square wave sequence signal.

9. The method according to claim 8, wherein the acquiring target waveform data according to the target output waveform information and a system parameter of a sequence signal generator comprises:

calculating the original square wave sequence data, the preliminary delay parameter, and an initial secondary delay parameter according to the target square wave waveform information and the system parameter;

determining whether the initial secondary delay parameter is in a preferred parameter range, wherein in the preferred parameter range, a deviation of a time delay chain composed of the secondary delay unit in the sequence signal generator is less than a preset threshold; and if the initial secondary delay parameter is less than a minimum value of the preferred parameter range, increasing the initial secondary delay parameter by a specified delay to acquire the secondary delay parameter so that each secondary delay parameter of the target waveform data is in the preferred parameter range.

10. The method according to claim 8, further comprising:

acquiring a waveform data correction value corresponding to the target waveform data by looking up a waveform data calibration comparison table, and using the waveform data correction value as the target waveform data.

11. The sequence signal generation method according to claim 8, wherein a quantity of the preliminary delay unit is determined so that a delay chain composed of the secondary delay unit is in a section of low non-linearity.

* * * * *